US010528691B1

(12) United States Patent
Ovadia

(10) Patent No.: US 10,528,691 B1
(45) Date of Patent: Jan. 7, 2020

(54) METHOD AND SYSTEM FOR AUTOMATED SELECTION OF A SUBSET OF PLURALITY OF VALIDATION TESTS

(71) Applicant: Cadence Design Systems, Inc., San Jose, CA (US)

(72) Inventor: Meir Ovadia, Rosh Ha-Ayin (IL)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 15/978,527

(22) Filed: May 14, 2018

(51) Int. Cl.
*G06F 17/50* (2006.01)
*G01R 31/28* (2006.01)

(52) U.S. Cl.
CPC ....... *G06F 17/504* (2013.01); *G01R 31/2834* (2013.01)

(58) Field of Classification Search
CPC .................................................... G06F 17/504
USPC ......................................................... 716/136
See application file for complete search history.

(56) References Cited

U.S. PATENT DOCUMENTS

| | | | |
|---|---|---|---|
| 8,433,953 B1* | 4/2013 | Gaudette | G06F 11/263 702/123 |
| 9,823,305 B1* | 11/2017 | Ovadia | G01R 31/3177 |
| 2005/0251715 A1* | 11/2005 | Loh | G01R 31/31835 714/736 |
| 2006/0036390 A1* | 2/2006 | Loh | G01R 31/2834 702/117 |
| 2007/0013362 A1* | 1/2007 | Loh | G01R 31/2886 324/750.01 |
| 2007/0094198 A1* | 4/2007 | Loh | G06N 5/04 706/47 |
| 2008/0071513 A1* | 3/2008 | Chickermane | G01R 31/31721 703/15 |
| 2014/0173222 A1* | 6/2014 | Alapati | G06F 12/0897 711/144 |
| 2015/0082263 A1* | 3/2015 | Vasudevan | G06F 17/50 716/106 |
| 2018/0336114 A1* | 11/2018 | Bair | G06F 17/50 |

* cited by examiner

*Primary Examiner* — Suchin Parihar
(74) *Attorney, Agent, or Firm* — Pearl Cohen Zedek Latzer Baratz LLP

(57) ABSTRACT

A method for automated selection of a subset of a plurality of validation tests for testing a device under test (DUT), may include obtaining the plurality of validation tests; using a processor, obtaining from a user, via an input device, one or a plurality of conditions relating to one or a plurality of execution parameters; and using a processor, analyzing each of the validation tests to identify a subset of the validation tests that includes verification tests conforming to said one or a plurality of conditions.

18 Claims, 4 Drawing Sheets

METHOD AND SYSTEM FOR AUTOMATED SELECTION OF A SUBSET OF PLURALITY OF VALIDATION TESTS

FIELD OF THE INVENTION

The present invention relates to verification and more particularly to methods and systems for automated selection of a subset of a plurality of validation tests for testing an electronic design.

BACKGROUND

Design verification is a common process for testing a newly designed integrated circuit, board, or system-level architecture, to, for example, confirm that it complies with the requirements defined by the specification of the architecture for that device. Design verification for a device under test (DUT) may be performed on the actual device, but can usually be a simulation model of the device is tested.

Verification of electronic designs may typically have three forms. At an early stage, before the electronic design is implemented in hardware, simulation can be conducted on a model of the design. Another form can be emulation, in which an electronic hardware may be used to mimic the behavior of another (tested) electronic hardware. At more advanced stages of design development, a system on chip may be validated, in a process which is typically referred to as post-silicon validation. Post-silicon validation can be a last stage in the electronic design development, for example, before it is manufactured.

An electronic system (e.g., a smartphone, a tablet, etc.) may typically be made up of a plurality of electronic devices (e.g., memory, camera, central processing unit—CPU, graphical processing unit—GPU, microphone, media player, etc.). At the early stages in the development of electronic design, a model of each of the electronic devices that form the electronic system can be built (typically in Verilog or other HDL language and verified, by simulating executions of a multitude of tests on the on a simulation of the DUT. In order to, for example, efficiently cover all (or substantially all) functionalities of the DUT a plurality of tests can be generated. The plurality of tests can be pieces of code, e.g., C-code, assembly, and/or other codes as are known in the art. Each of the plurality of tests can be generated from one of various scenarios which can be constructed by a one or a plurality of users. Each scenario can be made up of a plurality of actions which the user selects to be included in the scenario. The user may also define the order in which the selected actions are to be performed—consecutively or concurrently.

In a typical verification process an electronic design undergoes test regressions which includes designing various validated testing scenarios that are generated in a test code form and executed.

In the development process of an electronic product numerous tests can be designed and accumulated. In the verification process, the same test may be reused and rerun by selecting and/or later changing one or more of its execution modes and/or execution conditions. For example, running the test per each or any of the designated processor type (32 bits, or 64 bits), running the test per each or any type of compilers (e.g., Linux compilers, for example, GCC, G++, hardware compilers, for example, ARM compiler, simulation compilers, etc.), running the test with or without performing tracing, running the test in each or any of a list of debug levels (e.g., in verbosity levels such as, none, low, high, full), running only tests in which action a and action b are not performed concurrently, running only tests in which action a and action b are performed concurrently, etc. Other configuration modes may also be offered to be considered and selected.

As the number of accumulated tests soar it may become increasingly difficult and/or very inefficient to run all existing tests on a DUT, in all possible combinations of execution conditions and/or modes (hereinafter referred to as "execution parameters"), and it therefore may be desired to reduce the number of test to be run in a test regression, yet maintain efficient and qualitative testing.

SUMMARY

There is thus provided, according to some embodiments of the present invention, a method for automated selection of a subset of a plurality of validation tests for testing a DUT. The method may include obtaining the plurality of validation tests; using a processor, obtaining from a user, via an input device, one or a plurality of conditions relating to one or a plurality of execution parameters; and using a processor, analyzing each of the validation tests to identify a subset of the validation tests that includes verification tests conforming to said one or a plurality of conditions.

In some embodiments of the present invention, the analyzing includes presenting the plurality of validation tests in a graph form.

In some embodiments of the present invention, said one or a plurality of execution parameters are selected from the group of execution parameters consisting of: execution mode, 32-bit operating system, 64-bit operating system, debug level, compiler on which a test of said one or a plurality of validation tests is to be compiled, existence of corresponding "write" and "read" commands and execution with or without a library.

In some embodiments of the present invention, the execution parameters include negative conditions.

In some embodiments of the present invention, the execution parameters comprise positive conditions.

In some embodiments of the present invention, the method further includes executing the validation tests of the subset of validation tests on the DUT.

In some embodiments of the present invention, there is provided a non-transitory computer readable storage medium for automated selection of a subset of a plurality of validation tests for testing a device under test (DUT), having stored thereon instructions that when executed by a processor will cause the processor to obtain the plurality of validation tests; to obtain from a user, via an input device, one or a plurality of conditions relating to one or a plurality of execution parameters; and to analyze each of the validation tests to identify a subset of the validation tests that includes verification tests conforming to said one or a plurality of conditions.

There is also provided, in some embodiments of the present invention, a system for automated selection of a subset of a plurality of validation tests for testing a device under test (DUT). The system may include a memory and a processor configured to: obtain the plurality of validation tests; obtain from a user, via an input device, one or a plurality of conditions relating to one or a plurality of execution parameters; and analyze each of the validation tests to identify a subset of the validation tests that includes verification tests conforming to said one or a plurality of conditions.

BRIEF DESCRIPTION OF THE DRAWINGS

In order to better understand the present invention, and appreciate its practical applications, the following figures are provided and referenced hereafter. It should be noted that the figures are given as examples only and in no way limit the scope of the invention. Like components are denoted by like reference numerals.

DETAILED DESCRIPTION OF EMBODIMENTS OF THE INVENTION

Figure 1:
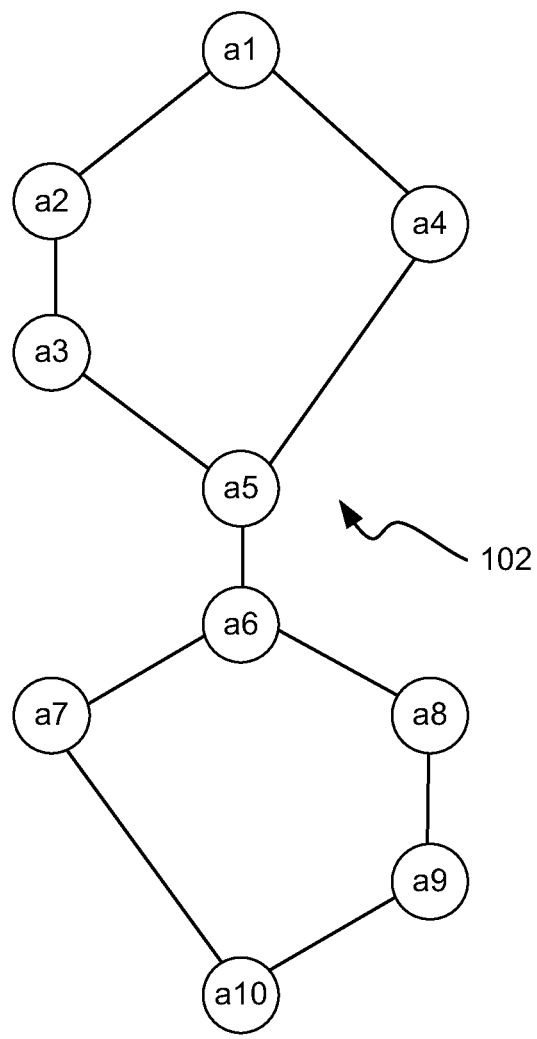
FIG. 1 shows a graph form presentation of a validation test, according to some embodiments of the present invention.

In the following detailed description, numerous specific details are set forth in order to provide a thorough understanding of the methods and systems. However, it will be understood by those skilled in the art that the present methods and systems may be practiced without these specific details. In other instances, well-known methods, procedures, and components have not been described in detail so as not to obscure the present methods and systems.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

Typically, an electronic system undergoes a fairly long production process that includes designing and verification of the design. In the verification process, a regression of verification tests is typically developed and used in order to ensure the appropriate functioning of the system and provide a high quality electronic system. In the course of time these verification tests may accumulate to increasingly large numbers. Furthermore, many of the verification tests, if not all, may be executed under various execution parameters and conditions.

In light of the steep increase in verification tests, it may be desired to find a way to reduce the number of executed tests while maintaining an appropriate level of test efficiency.

According to some embodiments of the present invention, system and method for automatically selecting a subset of validation tests for testing an electronic design is proposed, aimed at allowing a user to input one or a plurality of execution parameters of interest and obtain a subset of the verification tests that conform to said one or a plurality of execution parameters.

Typically there may be various kinds of execution parameters. For example, validation tests may be provided in different execution modes. For example, a verification test may be designed to run in 32 bit mode or in 64 bit mode. In another example, a verification test may be run at any of debug levels (e.g., none, low, high or full). In another example, a verification test may be designed to run in any of several operating systems, in which case it is compiled using a compiler designated to that particular operating system (e.g., simulator compiler, Gnu Compiler Collection (CGG), G++ compiler, ARM compiler). In another example, a user may be interested in discarding validation tests in which a "write" command is not accompanied by a corresponding "read" command (from the address in memory into which the "write" command has written). In another example, a user may be interested in validation tests in which at least 50 (or any other arbitrary number) percent of the "write" commands have corresponding "read" commands. In another example, a verification test may be executed with a specific library (or without such library), etc.

Some embodiments of the present invention may be implemented using an electronic design automation (EDA) tool that may allow a user to view a graph form presentation of a scenario or a test and to construct and rearrange the scenario by dragging actions (actually symbols of such actions) from a set of available actions into a designated space in a graphical user interface, defining the relations between the selected actions (the order in which they are to be performed—e.g., sequentially or in parallel). Typically, the graph form presentation of the test is in the form of a graph, e.g., a directed graph, where actions of the scenario are vertices (nodes) and are connected by directed edges. Such EDA tool may also obtain tests in code form and translate them into the graph form presentation.

A scenario may include, for example, a set of actions that is to be tested on the DUT. A validated scenario that complies with system requirements and with test requirements—may be converted into a test by generating executable code, such as, for example, C-code or System-Verilog (SV) code. That test may be fed to the DUT in the validation process to test its design.

A thread in computing can refer to a sequence of instructions in a program that may be executed on a single scheduler (e.g., a core of a processor). An executable program, or executable code—and in many cases just "executable", "process" or "binary" (hereinafter referred to as "executable") can be described as a computing entity that is designed to cause the computer perform various tasks. Typically an executable includes one of a plurality of threads.

Typically, each executable is assigned some memory (e.g., defined by addresses in virtual memory), which may be accessed by any of its threads.

According to some embodiments of the present invention, there is provided a method for automated selection of a subset of a plurality of validation tests for testing a DUT. This method includes (a) obtaining the plurality of validation tests; (b) using a processor, obtaining from a user, via an input device, one or a plurality of conditions relating to one or a plurality of execution parameters; and (c) using a processor, analyzing each of the validation tests to identify a subset of the validation tests that includes verification tests conforming to said one or a plurality of conditions. The analysis may, for example, include, analyzing the graph (e.g., going over the graph and identifying node or nodes that satisfy said one or a plurality of conditions).

According to some embodiments of the invention, the user may provide positive conditions (e.g., conditions which the user wants to find in the validation tests that are selected for the subset of verification tests), which may be used in automatically selecting the subset of validation tests.

In some embodiments of the invention the user may provide negative conditions (e.g., conditions which the user does not want to find in the validation tests that are selected for the subset of verification tests).

In some embodiments, the user provides said one or a plurality of execution parameters in the form of a file, in which the user may indicate conditions for execution parameters of interest which the user wants the subset of validation tests to conform to.

For example, the user may include one or more of the following conditions that meet one or more variants of various execution parameters, so as to cause the selection of a subset of validation tests that conform to these conditions, e.g.:

(a) execution parameter: execution mode, variants: test to be performed on a 32-bit operating system or on a 64-bit operating system;

(b) execution parameter debug level, variants: perform debugging on the test in one or more of the following levels: none, low, high or full;

(c) execution parameter: compiler, variants: test is to be compiled using one or more of the following compilers: simulator compiler, Gnu Compiler Collection (CGG), G++ compiler, or ARM compiler;

(d) execution parameter: "Write" command accompanied by a corresponding "read" command, variants: in the test all (or at least some—e.g., a desired percentage indicated by the user, or predefined) "write" commands have matching corresponding "read" commands, that are designed to read the data written by that "write" command;

(e) execution parameter: program library (resources used by that program), variants: execute the test with or without a certain library (or libraries);

(f) execution parameter: shared memory, variants: use shared memory "x" or shared memory "y";

(g) execution parameter: executables, variants: only a test with more than one executable is to be compiled by more than just one compiler;

(h) execution parameter: actions, variants: only a test with concurrently executed actions (e.g., action a4 and successive actions a2 and a3 in FIG. 1) that are executed on the same thread are to be tested in all shared-memory configurations;

(i) execution parameter: messages, variants: only tests with messages that contain "xxx" (a string or a variable, etc.) are to be executed with a flag/xxx.

FIG. 1 shows a graph form presentation of a validation test 102, according to some embodiments of the present invention. In this example action a1 is the earliest action to be performed. After action a1 is completed, actions a2, a3 and a4 are performed as follows: action a4 is performed concurrently with the successive performance of actions a2 and a3. After actions a1, a2 a3 and a4 are completed action a5 is performed, followed by action a6. After action a6 is completed actions a7 is performed concurrently with actions a8 and a9, which are performed successively. After actions a6, a7, a8 and a9 are completed action a10 is performed.

The graph form presentation of the test makes it fairly easy to understand and/or retrieve and/or determine various execution parameters that relate to the tests or to specific actions of that test.

For example, if the user sets a condition to only select tests that are executed on at least two executables, then, in analyzing the graph, a search is conducted to find at least two nodes which relate to different executables (e.g., find at least node1 and node2 that satisfy: node1.get-executable( )!=node2.get-executable( )). Other conditions for selecting tests may be, for example, selecting tests that have at least X number (any arbitrary integer defined by the user) of nodes, selecting tests with no more than X tests, selecting only tests that have exactly X nodes, selecting tests that have at least/exactly/no more than X "read" commands with existing corresponding "write" commands, selecting tests that have at least/exactly/no more than X actions with "reset" operation (or other operation), and combinations thereof.

According to some embodiments of the invention, a user may provide more than one condition. In some of such embodiments, for example when two or more conditions are provided, the user may require that (a) tests be selected only if all conditions are met ("AND" condition), (b) tests be selected only if either of the conditions is met ("OR" condition), and/or (c) tests be selected only if just one of the conditions is exclusively met ("exclusive OR" condition).

Figure 2A:
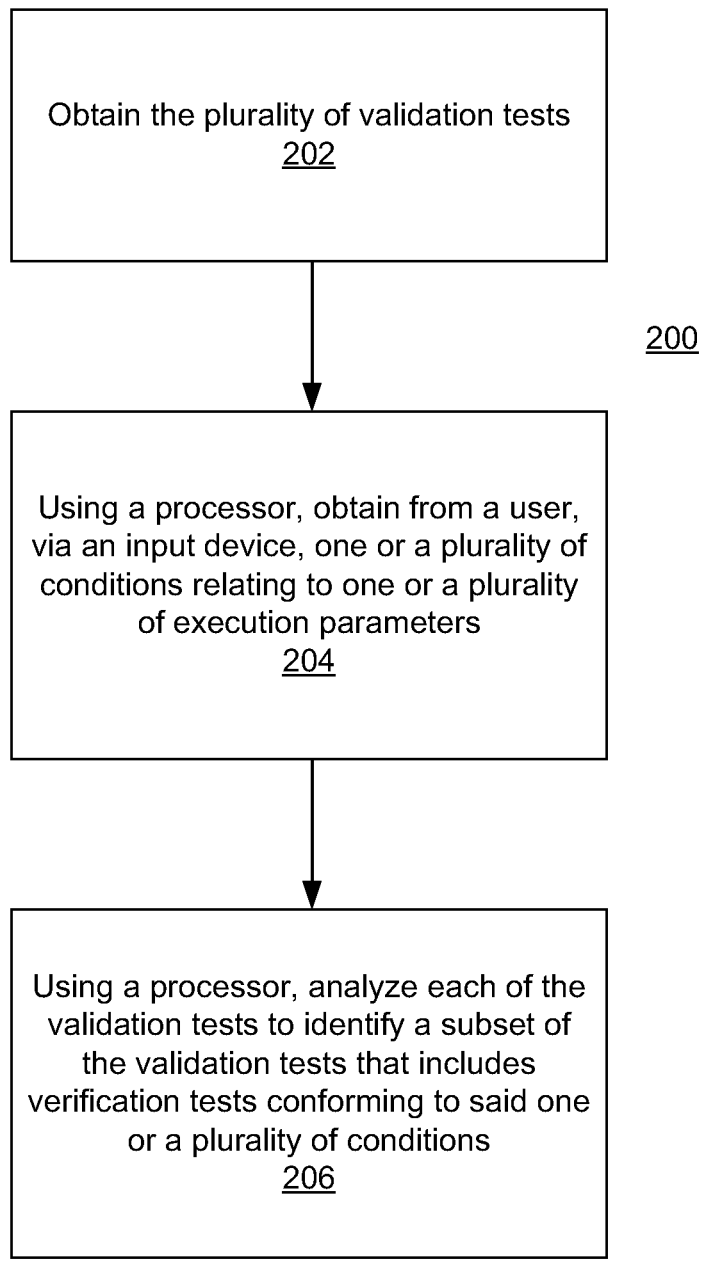
FIG. 2A is a flow chart of a method for automated selection of a subset of a plurality of validation tests for testing a DUT, according to some embodiments of the present invention.

FIG. 2A is a flow chart of a method 200 for automated selection of a subset of a plurality of validation tests for testing a DUT, according to some embodiments of the present invention.

Method 200 may include obtaining 202 the plurality of validation tests. Method 200 may also include using a processor, obtaining 204 from a user, via an input device, one or a plurality of conditions relating to one or a plurality of execution parameters. Method 200 may also include using a processor, analyzing 206 each of the validation tests to identify a subset of the validation tests that includes verification tests conforming to said one or a plurality of conditions.

Figure 2B:
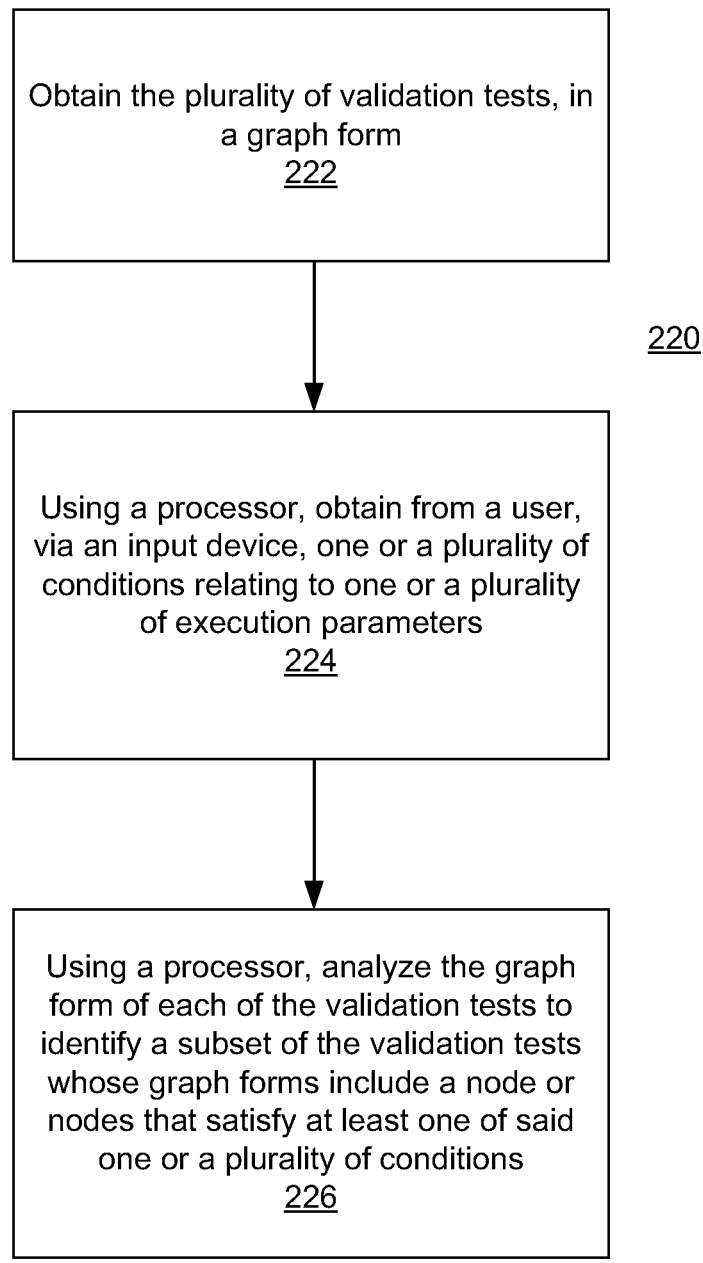
FIG. 2B is a flow chart of a method for automated selection of a subset of a plurality of validation tests for testing a DUT, according to some embodiments of the present invention.

FIG. 2B is a flow chart of a method 220 for automated selection of a subset of a plurality of validation tests for testing a DUT, according to some embodiments of the present invention.

Method 220 may include obtaining 222 the plurality of validation tests, each in a graph form; using a processor, obtaining 224 from a user, via an input device, one or a plurality of conditions relating to one or a plurality of execution parameters. Method 220 may also include, using a processor, analyzing 226 the graph form of each of the validation tests to identify a subset of the validation tests whose graph forms include a node or nodes that satisfy at least one of said one or a plurality of conditions.

In some embodiments of the invention the conditions are selected from the group of conditions consisting of: compiler type, operating system type, bit mode of operating system, debug or optimized mode, debug level, tracing level, use of shared memory.

In some embodiments of the invention, analyzing the graph form of each of the validation tests, comprises identifying a subset of the validation tests whose graph forms include a node or nodes that satisfy all of said one or a plurality of conditions.

In some embodiments of the invention, said one or a plurality of conditions includes a plurality of conditions, and analyzing the graph form of each of the validation tests, includes identifying a subset of the validation tests whose graph forms include a node or nodes that satisfy any of said plurality of conditions.

In some embodiments of the invention, a validation test is first run, or solved, in a default mode (e.g., default execution parameter or parameters) using an ETA tool. Then, the solved test may be analyzed. The user may provide one or a plurality of conditions for selection of a subset of all possible variations of execution parameters relating to the solved test, and based on these conditions a subset (that includes one or more tests) of validation tests may be obtained.

After the subset of validation tests is formed, this subset of tests may be arranged in a matrix form, and each test may be executed on the DUT.

According to some embodiments of the invention, after a test is executed, the EDA tool may analyze the test (or solution) and based on the conditions obtained from the user further select additional alternative execution parameters that meet these conditions.

Figure 3:
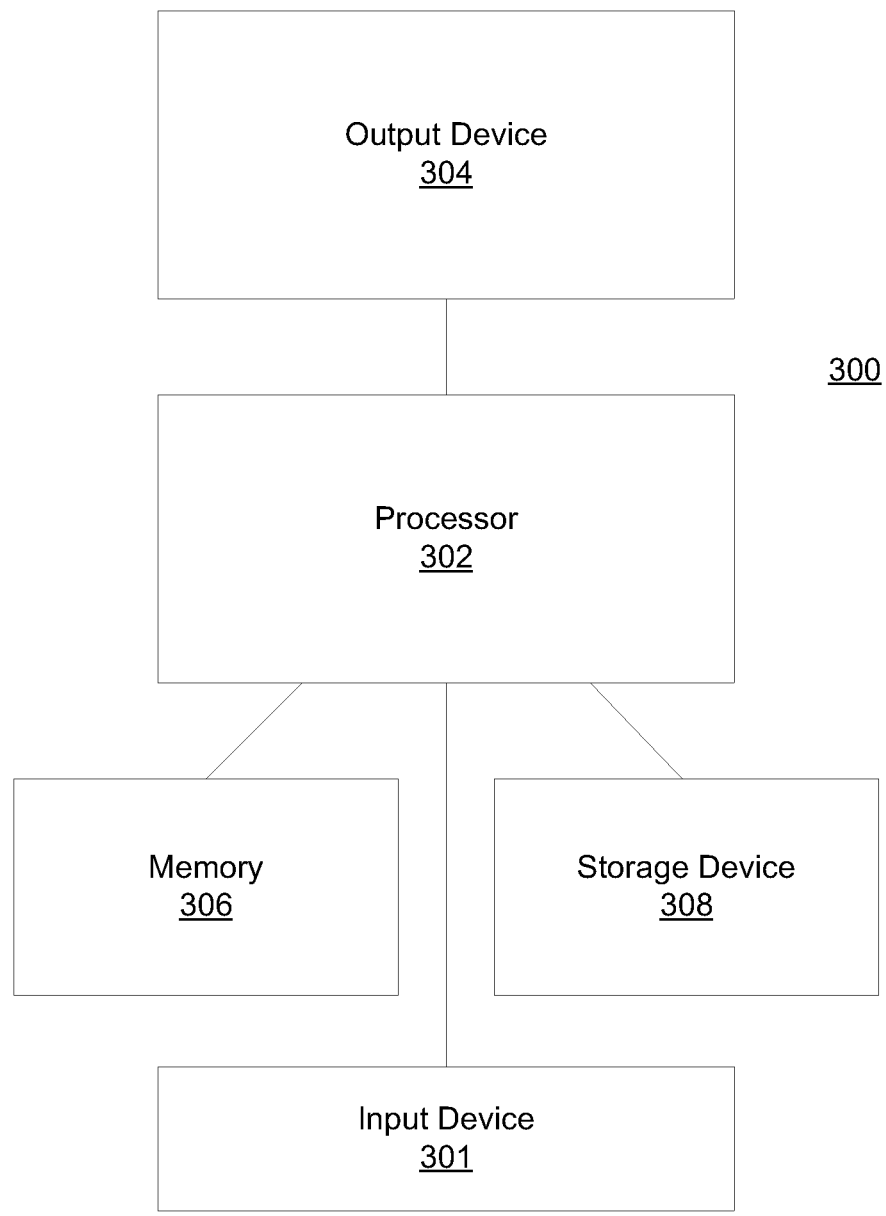
FIG. 3 is a schematic illustration of a system for automated selection of a subset of a plurality of validation tests for testing a DUT, according to some embodiments of the present invention.

In some embodiments of the invention, if a certain test matches more than one variant of an execution parameter and if these execution parameters are identified or marked as non-orthogonal then that test is to be executed in all variants of that execution parameter FIG. 3 illustrates a computing system 300 for automated selection of a subset of a plurality of validation tests for testing a DUT, according to some embodiments of the present invention. System 300 may include a processor 302 (e.g. single processor or a processing unit made that includes a plurality of processors, on a single machine or distributed on a plurality of machines) for executing a method according to some embodiments of the present invention. Processor 302 may include one or a plurality of processors, and be configured to perform processing steps in accordance with the present invention.

Processor 302 may be linked with memory 306 on which a program implementing a method according to some embodiments of the present invention and corresponding data may be loaded and run from, and storage device 308, which includes a non-transitory computer readable medium (or mediums) such as, for example, one or a plurality of hard disks, flash memory devices, etc. on which a program implementing a method according to some embodiments of the present invention and corresponding data may be stored. System 300 may further include an output device 304 (e.g. display device such as CRT, LCD, LED etc.) on which one or a plurality user interfaces associated with a program implementing a method according to some embodiments of the present invention and corresponding data may be presented. System 300 may also include input interface 301, such as, for example, one or a plurality of keyboards, pointing devices, touch sensitive surfaces (e.g. touch sensitive screens), etc. for allowing a user to input commands and data.

By employing methods and systems in accordance with some embodiments of the present invention, the process of validation may become more efficient and resource-efficient, as instead of running validation tests in all combinations of the related execution parameters (which may even be impossible to perform, due to too many possible validation tests and limited computational resources), a user may provide one or a plurality of conditions of interest and automatically obtain a reduced set of verification tests for testing the DUT, thus reducing verification time while maintaining acceptable or desired level of efficiency.

Some embodiments of the present invention may be embodied in the form of a system, a method or a computer program product. Similarly, some embodiments may be embodied as hardware, software or a combination of both. Some embodiments may be embodied as a computer program product saved on one or more non-transitory computer readable medium (or media) in the form of computer readable program code embodied thereon. Such non-transitory computer readable medium may include instructions that when executed cause a processor to execute method steps in accordance with examples. In some examples the instructions stores on the computer readable medium may be in the form of an installed application and in the form of an installation package.

Such instructions may be, for example, loaded by one or more processors and get executed.

For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof.

Computer program code may be written in any suitable programming language. The program code may execute on a single computer system, or on a plurality of computer systems.

Some embodiments are described hereinabove with reference to flowcharts and/or block diagrams depicting methods, systems and computer program products according to various embodiments.

Features of various embodiments discussed herein may be used with other embodiments discussed herein. The foregoing description of the embodiments has been presented for the purposes of illustration and description. It is not intended to be exhaustive or limiting to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes that fall within the true spirit of the present invention.

The invention claimed is:

1. A method for automated selection of a subset of a plurality of validation tests for testing a device under test (DUT), the method comprising:
   obtaining the plurality of validation tests, each in a graph form, wherein each graph comprises a plurality of nodes that define actions and edges that define relations between the actions;
   using a processor, obtaining from a user, via an input device, one or a plurality of conditions relating to one or a plurality of execution parameters; and
   using a processor, analyzing the graph form of each of the validation tests to identify a subset of the validation tests whose graph forms include a node or nodes of the plurality of nodes that satisfy at least one of said one or a plurality of conditions.

2. The method of claim 1, wherein the conditions are selected from the group of conditions consisting of: compiler type, operating system type, bit mode of operating system, debug or optimized mode, debug level, tracing level, use of shared memory.

3. The method of claim 1, wherein analyzing the graph form of each of the validation tests, comprises identifying a subset of the validation tests whose graph forms include a node or nodes that satisfy all of said one or a plurality of conditions.

4. The method of claim 1, wherein said one or a plurality of conditions comprises a plurality of conditions, and wherein analyzing the graph form of each of the validation tests, comprises identifying a subset of the validation tests whose graph forms include a node or nodes that satisfy any of said plurality of conditions.

5. The method of claim 1, wherein said one or a plurality of conditions comprises a plurality of conditions, and wherein analyzing the graph form of each of the validation tests, comprises identifying a subset of the validation tests whose graph forms include a node or nodes that satisfy just one of said plurality of conditions.

6. The method of claim 1, further comprising, executing the validation tests of the subset of validation tests on the DUT.

7. A non-transitory computer readable storage medium for automated selection of a subset of a plurality of validation tests for testing a device under test (DUT), having stored thereon instructions that when executed by a processor will cause the processor to:
obtain the plurality of validation tests, comprising a plurality of actions and relations between the plurality of actions;
obtain from a user, via an input device, one or a plurality of conditions relating to one or a plurality of execution parameters; and
analyze each of the validation tests to identify a subset of the validation tests that includes a set of actions selected from the plurality of actions that conforms to said one or a plurality of conditions.

8. The non-transitory computer readable storage medium of claim 7, wherein the analyzing comprises presenting the plurality of validation tests in a graph form, wherein the graph comprises nodes that represent the actions and edges that represent relations between the actions.

9. The non-transitory computer readable storage medium of claim 7, wherein said one or a plurality of execution parameters are selected from the group of execution parameters consisting of: execution mode, 32-bit operating system, 64-bit operating system, debug level, compiler on which a test of said one or a plurality of validation tests is to be compiled, existence of corresponding "write" and "read" commands, program library, shared memory, actions and messages.

10. The non-transitory computer readable storage medium of claim 7, wherein the execution parameters comprise negative conditions.

11. The non-transitory computer readable storage medium of claim 7, wherein the execution parameters comprise positive conditions.

12. The non-transitory computer readable storage medium of claim 7, having stored thereon instructions that when executed by a processor will cause the processor further to execute the validation tests of the subset of validation tests on the DUT.

13. A system for automated selection of a subset of a plurality of validation tests for testing a device under test (DUT), the system comprising:
a memory and
a processor configured to:
obtain the plurality of validation tests, comprising a plurality of actions and relations between the plurality of actions;
obtain from a user, via an input device, one or a plurality of conditions relating to one or a plurality of execution parameters; and
analyze each of the validation tests to identify a subset of the validation tests that includes a set of actions selected from the plurality of actions that conforms to said one or a plurality of conditions.

14. The system of claim 13, wherein the processor is configured when analyzing to present the plurality of validation tests in a graph form, wherein the graph comprises nodes that represent the actions and edges that represent relations between the actions.

15. The system of claim 13, wherein said one or a plurality of execution parameters are selected from the group of execution parameters consisting of: execution mode, 32-bit operating system, 64-bit operating system, debug level, compiler on which a test of said one or a plurality of validation tests is to be compiled, existence of corresponding "write" and "read" commands, program library, shared memory, actions and messages.

16. The system of claim 13, wherein the execution parameters comprise negative conditions.

17. The system of claim 13, wherein the execution parameters comprise positive conditions.

18. The system of claim 13, wherein the processor is further configured to execute the validation tests of the subset of validation tests on the DUT.

* * * * *